Figure 1:
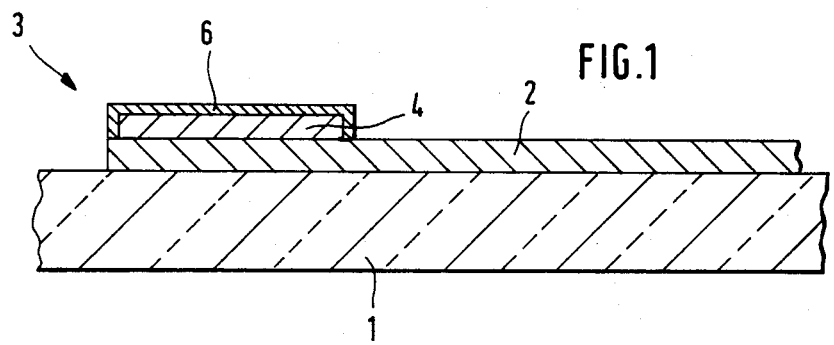

United States Patent [19]
Nickol

[11] Patent Number: 4,511,634
[45] Date of Patent: Apr. 16, 1985

[54] SOLDERABLE LAYER SYSTEM
[75] Inventor: Friedrich W. Nickol, Eppstein, Fed. Rep. of Germany
[73] Assignee: VDO Adolf Schindling AG, Frankfurt am Main, Fed. Rep. of Germany
[21] Appl. No.: 354,467
[22] Filed: Mar. 3, 1982
[30] Foreign Application Priority Data Mar. 20, 1981 [DE] Fed. Rep. of Germany ....... 3110978

[51] Int. Cl.³ ..................... H01L 23/48; H01L 29/46; H01L 1/14
[52] U.S. Cl. .................................. 428/686; 428/469; 428/666; 428/929; 428/622; 428/623; 428/629; 428/632; 428/633; 428/639; 428/650; 428/651; 428/652; 428/653; 428/654; 428/646; 428/647; 428/648; 428/642; 428/660; 428/661; 148/31.5
[58] Field of Search ................ 200/268, 269; 428/469, 428/666, 929, 622, 623, 629, 632, 633, 639, 650–654, 646–648, 642, 660, 661, 686; 148/31.5

[56] References Cited
U.S. PATENT DOCUMENTS 3,794,517 2/1974 Yperman et al. .................... 428/632
4,283,118 8/1981 Inoue ..................................... 357/71
4,380,775 4/1983 Bischoff .............................. 428/620

Primary Examiner—Veronica O'Keefe
Attorney, Agent, or Firm—Martin A. Farber

[57] ABSTRACT

The invention refers to a corrosion-proof solderable system of layers which is applied to a support and is made of a solderable layer and a corrosion-protection layer covering the solderable layer and protecting it from complete oxidation. In order to create a layer system which is simpler and cheaper to manufacture, the solderable layer contains a proportion of oxidizable metal.

The corrosion-protection layer is made by oxidation of the solderable layer on its free surface.

3 Claims, 2 Drawing Figures

U.S. Patent     Apr. 16, 1985     4,511,634

SOLDERABLE LAYER SYSTEM

The present invention refers to a corrosion-resistant solderable layer system which is applied to a support with a non-solderable conductive layer, and the layer system is directly or indirectly connected to the conductive layer and is made of a solderable layer and a corrosion-protection layer which covers said solderable layer and protects it from oxidation, the corrosion-protection layer comprising an oxidizable metal according to U.S. patent application Ser. No. 286,102, filed July b 22, 1981, the disclosure of which is hereby incorporated by reference herein.

In the layer system described in that patent application, oxidation of the solderable layer, which consists preferably of copper or iron, is to be prevented by the corrosion protection layer. This corrosion protection layer, which consists of an oxidizable material, covers the solderable layer and is completely oxidized in a high-temperature process.

A special operation is necessary in order to apply the corrosion-protection layer.

The object of the invention is therefore to create a layer system in accordance with the introductory concept which is simpler and cheaper to manufacture.

This object is achieved in accordance with the invention in the manner that the solderable layer (4) contains a portion of an oxidizable metal. As a result of the portion of an oxidizable metal, the corrosion protection layer is formed on the free surface of the solderable layer. Thus no special operation is necessary for the application of the corrosion-protection layer. In addition to a saving of work time this also results in the elimination of the equipment necessary for the application of a special corrosion protection layer.

The solderable layer (4) preferably contains portions of aluminum and/or chromium and/or indium and/or titanium and/or tin.

A corrosion protection layer which definitely completely covers the solderable layer can be obtained by forming the corrosion protection layer (6, 6') by oxidation on the free surface of the solderable layer (4) in a high-temperature treatment.

Figure 2:
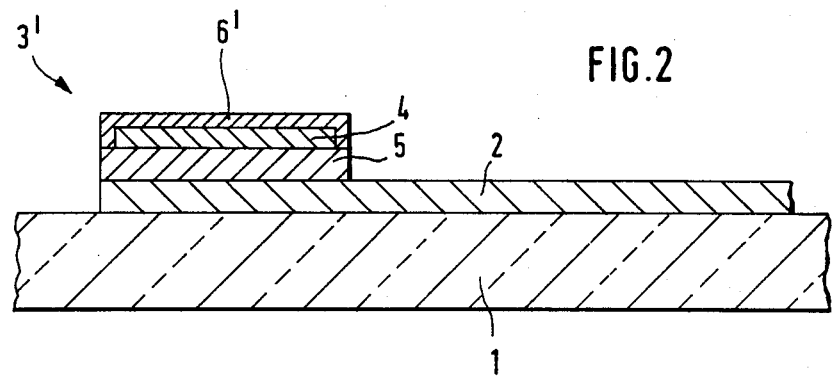

With the above and other objects and advantages in view, the present invention will become more clearly understood in connection with the detailed description of preferred embodiments when considered with the accompanying drawings, of which:

FIG. 1 is a broken-away sectional view of a first illustrative embodiment of a layer system in accordance with the invention; and FIG. 2 is a broken away sectional view of a second embodiment of a layer system in accordance with the invention.

The solderable layer systems 3 and 3' shown in the figures are applied to a support 1 of glass which serves as one wall of a liquid-crystal cell.

Onto the support 1 there is applied, in a thickness of preferably 250 to 1500 Å, a conductive layer 2 which may be made of indium tin oxide. The layer systems 3 and 3' form solderable connection points for this non-solderable conductive layer 2 by which, for instance, the terminals of integrated circuits developed as chips can be connected to the conductive layer 2.

In layer system 3 shown in FIG. 1, a solderable layer 4, comprising copper or iron with portions of for instance indium and tin, is applied directly to the conductive layer 2, while in FIG. 2 a bond-promoting layer 5 of chromium, titanium or aluminum which further strengthens the bond to the support 1 is provided between the solderable layer 4 and the conductive layer 2.

In order to protect the solderable layer 4 from oxidation, it is provided on its free surface with a corrosion protection layer 6 or 6'.

This corrosion protection layer 6 or 6' is formed by subjecting the layer system applied to the support 1 to a high-temperature process and the indium and tin are thereby oxidized in the peripheral region of the solderable layer 4.

Oxidation of the solderable layer 4 is no longer possible due to the protective corrosion protection layer 6 or 6'.

In this way corrosion protection of the solderable layer 4 is obtained without substantial expense by the method of the invention.

A precisely defined thickness of the corrosion protection layer 6 or 6' can be obtained by a suitable selection of the temperature and of the duration of the high-temperature process.

While there have been disclosed two embodiments, these embodiments are given by way of example only, and not in a limiting sense.

I claim:

1. A layer arrangement in an intermediate stage of manufacture of a transparent display prior to an oxidation process comprising
   a corrosion-resistant solderable layer system connected at least indirectly to an oxidizable conductive layer,
   a support on which the layer system and the conductive layer are applied,
   said layer system (in said intermediate stage of manufacture prior to said oxidation process) comprises a solderable layer comprising a metal selected from the group consisting of iron and copper, and including adjacent at least a free surface of said solderable layer oxidizable means for forming upon the subsequent oxidation process by oxidation of said means only adjacent said free surface of the solderable layer a corrosion-protection layer covering and protecting said solderable layer at least adjacent said conductive layer from oxidation,
   said solderable layer including said means comprising a portion of oxidizable metal other than iron and copper, and
   said portion of said oxidizable metal comprising at least one metal selected from the group consisting of aluminum, chromium, indium, titanium and tin.

2. The system according to claim 1, further comprising
   a bond-promoting layer disposed between said solderable layer and said conductive layer.

3. The system according to claim 1, wherein
   the conductive layer is indium tin oxide and has a thickness of substantially 250 to 1500 Å.

* * * * *